United States Patent
Sakemi et al.

[11] Patent Number: 6,166,415
[45] Date of Patent: Dec. 26, 2000

[54] SEMICONDUCTOR DEVICE WITH IMPROVED NOISE RESISTIVITY

[75] Inventors: Kazuhiro Sakemi; Shigeru Kikuda; Satoshi Kawasaki, all of Hyogo, Japan

[73] Assignees: Mitsubishi Denki Kabushiki Kaisha; Mitsubishi Electric Engineering Company Limited, both of Tokyo, Japan

[21] Appl. No.: 09/184,083

[22] Filed: Nov. 2, 1998

[51] Int. Cl.[7] .............. H01L 29/76; H01L 29/94; H01L 31/062; H01L 31/113; H01L 31/119

[52] U.S. Cl. .............. 257/372; 257/546; 257/547; 257/355; 257/365; 257/503

[58] Field of Search ................. 257/274, 277, 257/355, 365, 372, 503, 516, 546, 547

[56] References Cited

U.S. PATENT DOCUMENTS

| | | |
|---|---|---|
| 5,066,997 | 11/1991 | Sakurai et al. . |
| 5,235,201 | 8/1993 | Honna ................................ 257/357 |
| 5,304,835 | 4/1994 | Imai et al. . |
| 5,371,032 | 12/1994 | Nishihara . |
| 5,679,971 | 10/1997 | Tamba et al. ........................ 257/357 |
| 5,767,542 | 6/1998 | Nakamura .......................... 257/296 |
| 5,898,205 | 4/1999 | Lee ..................................... 257/355 |
| 5,986,867 | 11/1999 | Duvvury et al. ................... 361/111 |

FOREIGN PATENT DOCUMENTS

| | | |
|---|---|---|
| 2-133958 | 5/1990 | Japan . |
| 5-206408 | 8/1993 | Japan . |
| 9-107028 | 4/1997 | Japan . |
| 9-181159 | 7/1997 | Japan . |
| WO 92/02044 | 2/1992 | WIPO . |

*Primary Examiner*—Sheila V. Clark
*Assistant Examiner*—Jesse A Fenty
*Attorney, Agent, or Firm*—McDermott, Will & Emery

[57] ABSTRACT

A dummy pattern that is inserted to stabilize the form of a transistor active region is implanted with an impurity of the same conductivity type as a well, and the impurity-doped region of the dummy pattern is supplied with a potential through a metal interconnection. Hence, fluctuation of a well potential due to noise hardly occurs, and a semiconductor device enduring latch up, for example, to a greater extent can be provided.

8 Claims, 19 Drawing Sheets

SEMICONDUCTOR DEVICE WITH IMPROVED NOISE RESISTIVITY

BACKGROUND OF THE INVENTION

1. Field of the Invention

The present invention relates to a semiconductor device and more specifically to a semiconductor device of which noise resistivity is improved by utilizing a dummy field.

2. Description of the Background Art

With higher integration of semiconductor devices, elements such as transistors included in the semiconductor devices are miniaturized.

Conventionally, the LOCOS (Local Oxidation of Silicon) method was mainly used for isolating such elements as transistors. In recent years, trench isolation capable of attaining a narrower isolating region has been utilized. In trench isolation, a trench is formed at a main surface of a semiconductor substrate and the trench is filled with an insulating material to isolate elements.

In order to fill the trench with an insulating material, the insulating material is once deposited on the entire main surface of the semiconductor substrate after formation of the trench, and the insulating material is removed in a region where the trench was not formed. The most effective method of this kind is chemical mechanical polishing (hereinafter referred to as CMP).

When the trench width is large in the CMP process, however, the insulating layer is excessively etched at the center of the trench and dented in a dish shape. Thus, a "dishing phenomenon" is caused and precision in the form of the active region that is the region other than the isolating region is lowered.

In order to address this problem, a dummy pattern as a region where a trench is not formed is inserted in a region where the trench width is large. Hereinafter, a dummy active region formed by this dummy pattern is referred to as a dummy field.

FIG. 29 is a view for illustrating a dummy field.

In FIG. 29, a portion where an element isolation trench is not formed, that is, an active region and a dummy field are shown by oblique lines. FIG. 29 shows a region on the periphery of a pad 302 on a larger scale.

Referring to FIG. 29, a region 314 for forming transistors and the like is provided adjacent to pad 302. In region 314, guard rings 304, 306 are provided which are for supplying fixed potentials such as a power supply potential and a grand potential to a well where a transistor is formed. In guard rings 304, 306, regions 310 and 308 are provided on which gate electrodes are placed to form transistors.

A region 318 is an element isolating region in a portion other than region 314 and has at least a prescribed width. In region 318, dummy fields 312 are regularly provided at regular intervals to solve the above mentioned problem. Preferably, dummy fields having almost the same size as regions 308, 310 for forming transistors are regularly arranged at regular intervals, as shown in FIG. 29, to planarize the entire surface in the CMP process. However, a large dummy field may be provided in region 318.

FIG. 30 is a cross sectional view showing the cross section of a portion where a dummy field is formed.

Referring to FIG. 30, a P well 72 is formed in a P substrate 62, a trench for element isolation is provided in the P well, and the trench is filled with an insulating material 70.

A region 77 is a region other than the element isolating region at a main surface of P well 72, and a transistor is formed in region 77. A gate electrode 76 is provided on region 77. Impurity-doped region 80 serving as a source or a drain is provided on both sides of gate electrode 76. FIG. 30 shows a portion where an N channel MOS transistor is formed and, in this case, impurity-doped region 80 is implanted with an impurity of an N type.

Meanwhile, a region, where a transistor is not formed, in a portion other than the element isolating region is a dummy field 84, and this field is also usually implanted with an impurity of the same conductivity type as the source/drain region of an adjacent transistor.

The source/drain region of each transistor is connected to a first metal interconnection layer 88 through a contact hole. A second metal interconnection layer 90 is formed on first metal interconnection layer 88 with an insulating layer interposed therebetween.

FIG. 31 shows a typical layout of a semiconductor memory device.

Referring to FIG. 31, the semiconductor memory device includes memory blocks MBn arranged in two rows and two columns on semiconductor substrate 500. In a region CRS formed along a line segment connecting the middle points of the shorter sides of rectangular semiconductor substrate 500 and between memory blocks MBn, a power supply circuit IPS for generating an internal power supply potential, a terminal and input/output circuit DI for inputting/outputting data, a PLL circuit PL for generating clocks, a clock buffer CKB for distributing the clocks to each memory block and a control circuit, for example, and an address input buffer ABUF are provided. Further, a control circuit CC is provided at the center of the semiconductor substrate.

Since transistors are regularly and densely arranged in memory blocks MBn in such a semiconductor memory device, the above described dummy fields are rarely required. In the semiconductor memory device, the dummy fields are provided in regions other than the memory blocks, that is, region CRS formed along a line segment connecting the middle points of the shorter sides of semiconductor substrate 500 and between the memory blocks, a region CRL formed along a line segment connecting the middle points of the longer sides of semiconductor substrate 500 and between the memory blocks, and the outer peripheral portion of semiconductor substrate 500 in FIG. 31. Hereinafter, these regions are referred to as a periphery region.

Conventional dummy fields were arranged only for the purpose of precisely shaping the form of a transistor formation portion. Therefore, the dummy field themselves were not electrically connected to the first metal interconnection as shown in FIG. 30 and they were floating nodes. Thus, any design merits were not found.

SUMMARY OF THE INVENTION

An object of the present invention is to provide a semiconductor device of which noise resistivity is improved by using a dummy field to stabilize, for example, a well potential.

Another object of the present invention is to prevent deterioration in the performance of an input protection element when a dummy field is provided.

In summary, the present invention is a semiconductor device formed on a main surface of a semiconductor substrate wherein the semiconductor device includes a plurality of active regions, an isolating region, a dummy active region, and an interconnection.

Elements are formed in the plurality of active regions. The isolating region electrically isolates the plurality of active regions. The dummy active region is provided in the isolating region having at least a prescribed width in order to stabilize the forms of the plurality of active regions. The interconnection is electrically connected to the dummy active region and supplies the dummy active region with a potential.

According to another aspect of the present invention, a semiconductor device includes a plurality of active regions, an isolating region, a dummy active region, a pad, internal circuitry and a protection element.

Elements are formed in the plurality of active regions.

The isolating region electrically isolates the plurality of active regions.

The dummy active region is provided in the isolating region having at least a prescribed width for stabilizing the form of the active region.

The pad is provided for transmitting and receiving a signal to and from the outside.

The internal circuitry transmits and receives the signal through the pad and performs a prescribed processing.

The protection element is provided for protecting the internal circuitry from a surge applied to the pad from the outside.

The protection element is provided at a main surface of a well region of a first conductivity type, and includes
    a first impurity-doped region of a second conductivity type electrically connected to the pad,
    a second impurity-doped region of the second conductivity type connected to a power supply node and provided opposite to the first impulity-doped region to absorb the surge, and
    an isolating region having at least the prescribed width where the dummy active region is not provided for isolating the first impulity-doped region and the second impurity-doped region.

Therefore, a main effect of the present invention is that latch up is suppressed by reinforcing fixage of the well potential.

Another advantage of the present invention is that the dummy field can be provided without degrading the performance of the protection element.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

For simplicity of description, circuit arrangement without a dummy field will be described first.

Figure 1:
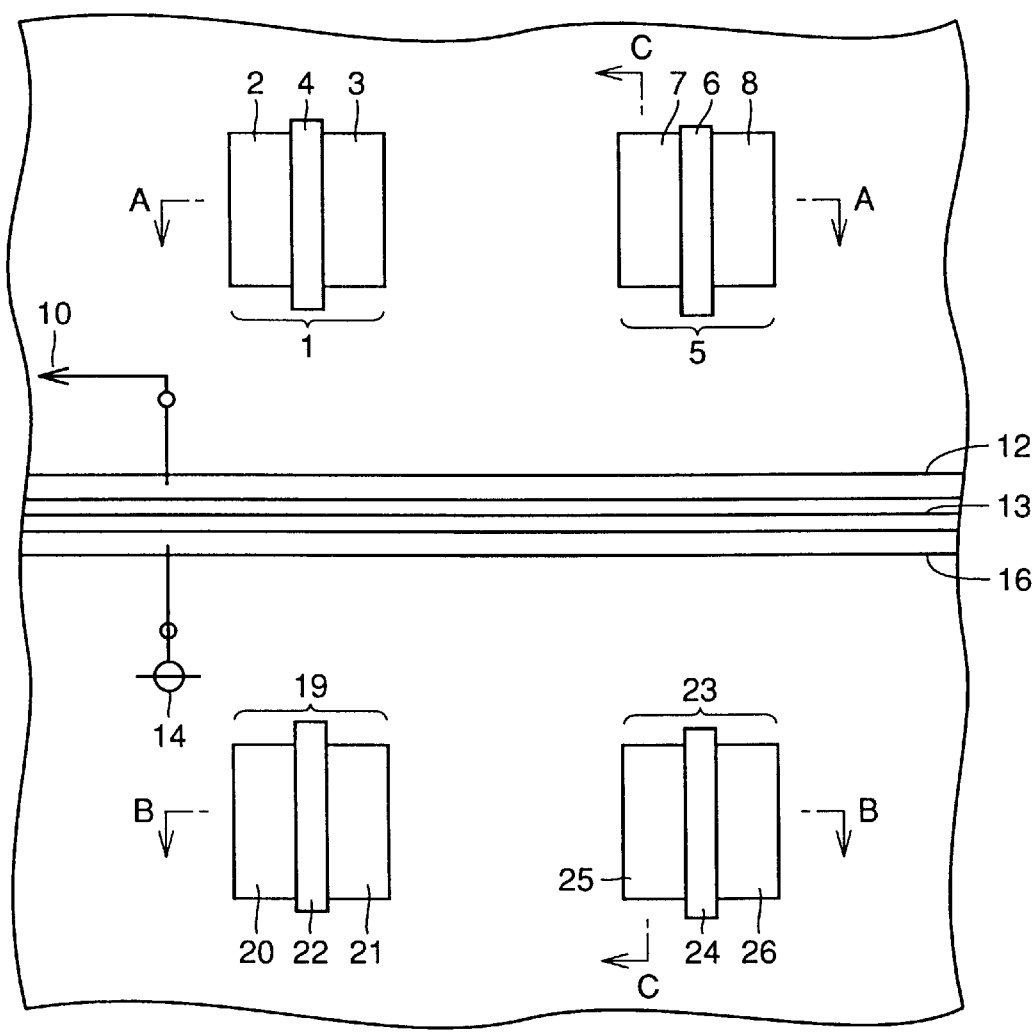
FIG. 1 is a plan view showing a layout example without a dummy field.

Referring to FIG. 1, transistors 1, 5 are provided on a P well formed on a main surface of a semiconductor substrate, and transistors 19, 23 are provided on a N well. Guard rings 12, 16 are provided along a boundary 13 between the P well and the N well.

Guard ring 12 is connected to a node 10 supplied with a ground potential or a negative substrate potential, and guard ring 16 is connected to a node 14 supplied with a power supply potential or a boosted potential. Transistor 1 is formed of impurity-doped regions 2, 3 and a gate electrode 4. Transistor 5 is formed of impurity-doped regions 7, 8 and a gate electrode 6. Transistor 19 is formed of impurity-doped regions 20, 21 and a gate electrode 22. Transistor 23 is formed of impurity-doped regions 25, 26 and a gate electrode 24.

The cross sectional structure will be described in the following.

Figure 2:
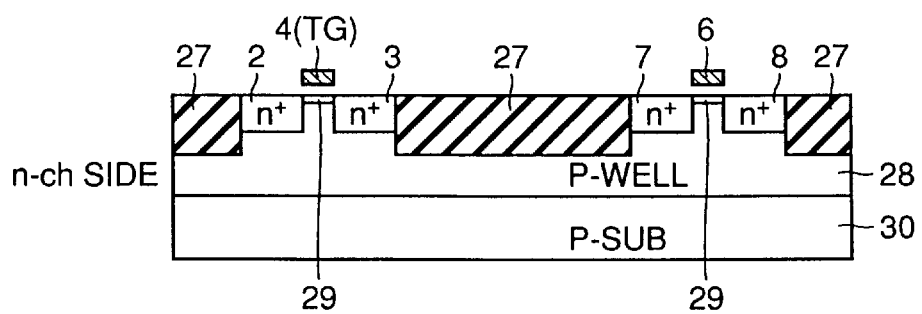
FIG. 2 is a cross sectional view showing the A—A cross sectional structure in FIG. 1.

Referring to FIG. 2, gate electrodes 4, 6 are provided on a P well 28 provided on the main surface of a P type semiconductor substrate 30, and N type impurity-doped regions 2, 3 are provided in P well 28 on both sides of gate electrode 4. Similarly, impurity-doped regions 7, 8 are provided in P well 28 on both sides of gate electrode 6. A channel dope region 29 for controlling a threshold is provided in P well 28 under the gate electrode, and an insulating material is filled in a trench in an element isolating region 27 between the transistors.

Figure 3:
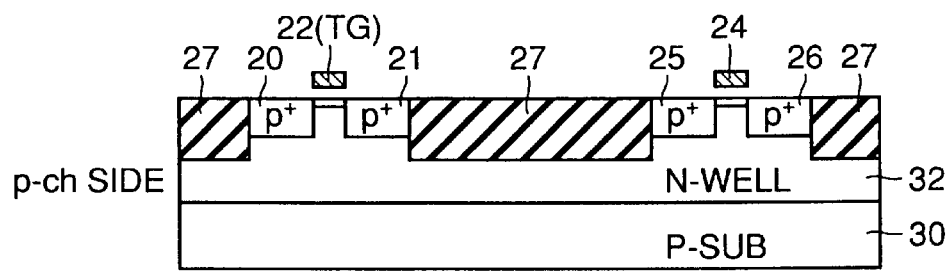
FIG. 3 is a cross sectional view showing the B—B cross sectional structure in FIG. 1.

Referring to FIG. 3, in the B—B cross section in FIG. 1, gate electrodes 22, and 24 are provided on an N well 32 provided in P type substrate 30. On both sides of gate electrode 22, P type impurity-doped regions 20, 21 are provided in N well 32. Similarly, P type impurity-doped regions 25, 26 are provided in N well 32 on both sides of gate electrode 24.

Figure 4:
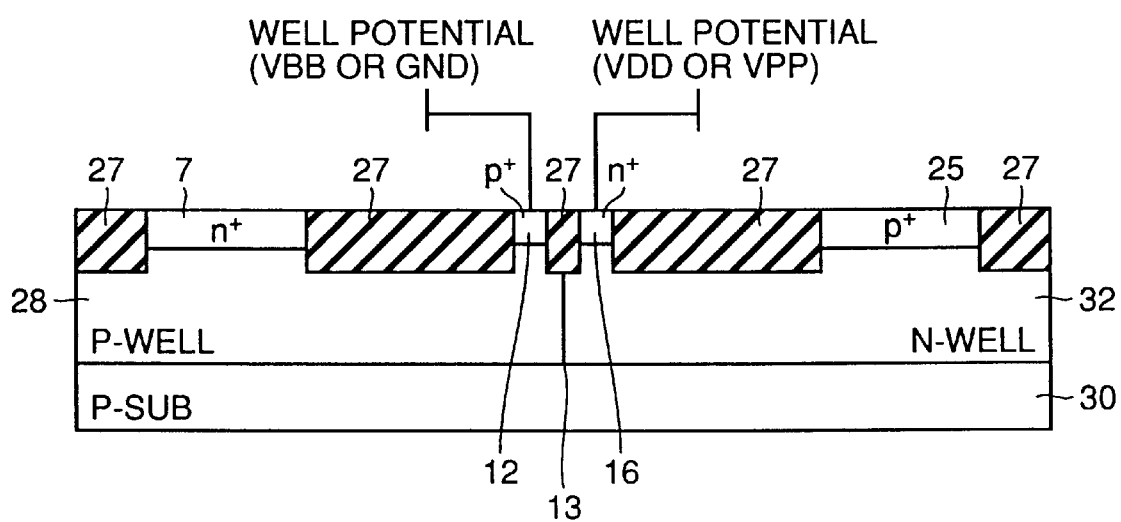
FIG. 4 is a cross sectional view showing the C—C cross sectional structure in FIG. 1.

Referring to FIG. 4, in the C—C cross section in FIG. 1, P well 28 and N well 32 are formed on both sides of boundary 13 in P type substrate 30, and impurity-doped region 7 is formed in P well 28. An impurity-doped region 12 of the same conductivity type as the well is formed in a portion adjacent to boundary 13 in P well 28, and impurity-doped region 12 is supplied with a substrate potential or a ground potential which is the well potential.

Meanwhile, P type impurity-doped region 25 is formed in N well 32, an impurity-doped region 16 of the same conductivity type as the well is formed in a portion adjacent to boundary 13 in N well 32, and impurity-doped region 16 is supplied with a power supply potential or a boosted potential that is the well potential of the N well.

The impurity-doped regions are isolated by element isolating region 27, and an insulating material is filled in a trench in element isolating region 27.

[First Embodiment]

An embodiment for improving noise resistivity by forming a dummy field in arrangement of elements shown in FIG. 1 will be described in the following.

Figure 5:
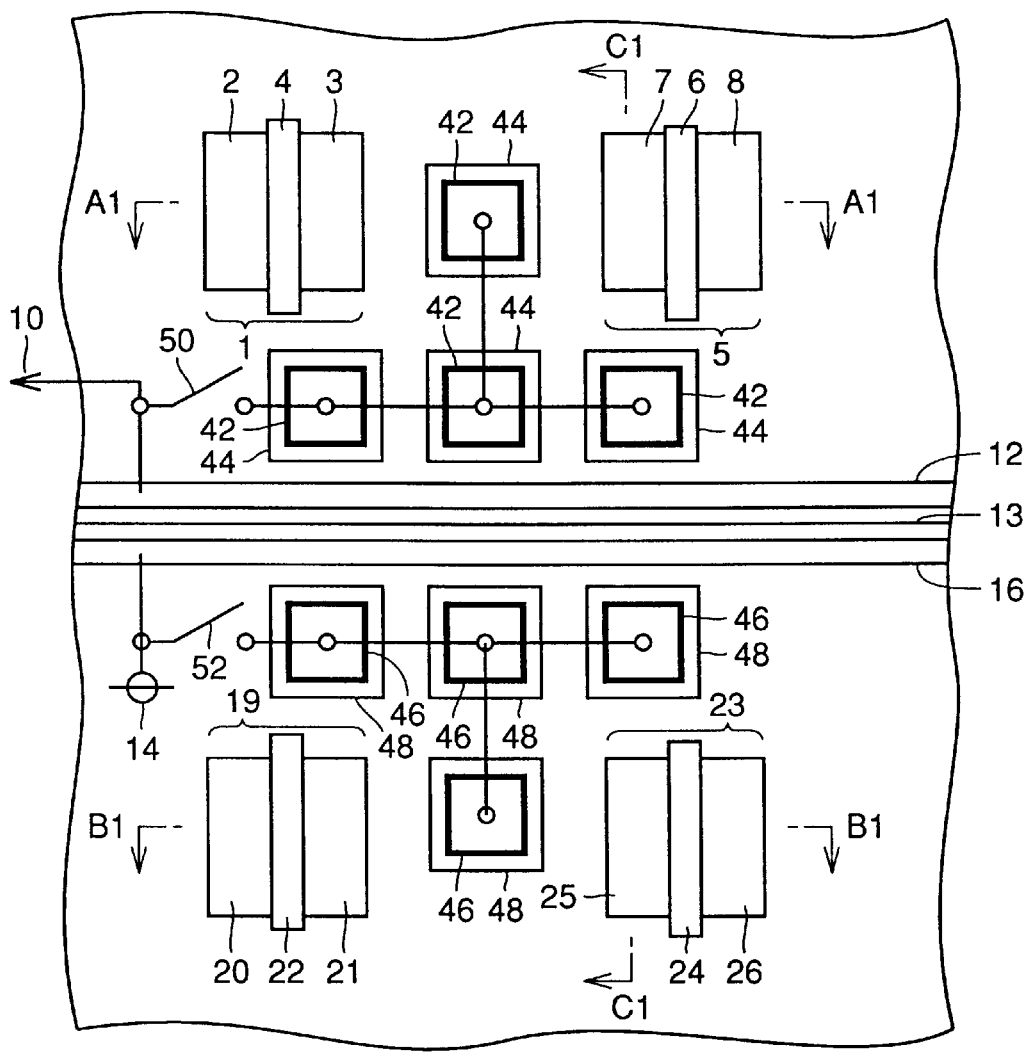
FIG. 5 is a plan view showing an arrangement example of a semiconductor device in a first embodiment of the present invention.

Referring to FIG. 5, four dummy fields 42 are provided in a region sandwiched between impurity-doped regions 3, 7 and 12. A region 44 shown outside dummy field 42 is a mask pattern for implanting an impurity into the dummy field.

Similarly, four dummy fields 46 are provided in a region sandwiched between impurity-doped regions 21, 25 and 16. A region 48 shown outside dummy field 46 is a mask pattern for implanting an impurity into the dummy field.

Dummy fields 42 are electrically connected by interconnections and these interconnections are supplied with the same fixed potential as the well through a switch 50.

Similarly, dummy fields 46 are electrically connected by interconnections and these interconnections are supplied with the same fixed potential as the well through a switch 52.

Since several types can be assumed as the potentials to be supplied to the dummy fields as described below, switches 50, 52 are shown to select and supply suitable potentials. Since the selection is usually determined by connection of the interconnections, however, a switch element does not particularly have to be provided.

The cross sectional structure will be described in the following.

Figure 6:
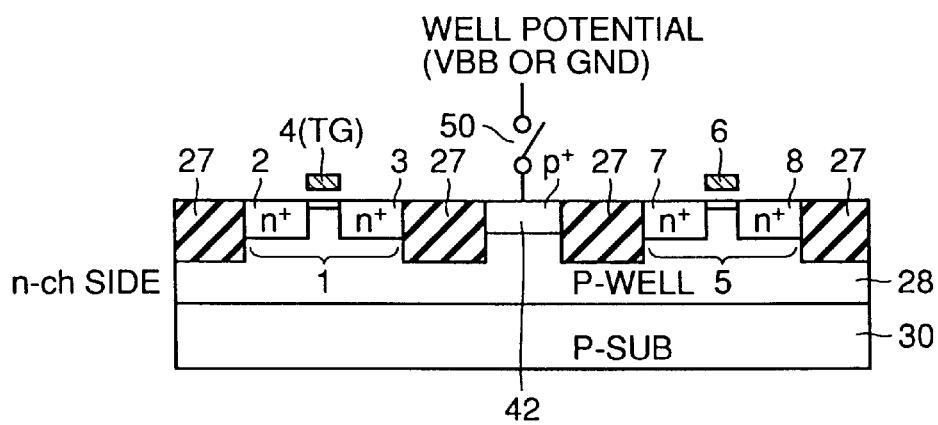
FIG. 6 is a cross sectional view showing the A1—A1 cross sectional structure in FIG. 5.

Referring to FIG. 6, in the A1—A1 cross section in FIG. 5, P well 28 is formed in P type substrate 30, and N type transistors 1, 5 and dummy field 42 are provided on and in P well 28. Transistor 1 is formed of N type impurity-doped regions 2, 3 and gate electrode 4. Transistor 5 is formed of impurity-doped regions 7, 8 and gate electrode 6. Transistors 1, 5 and dummy field 42 are electrically isolated by element isolating region 27.

Dummy field 42 is implanted with an impurity of the same conductivity type as the well, and dummy field 42 can be supplied with the same potential (substrate potential VBB or ground potential Vss) as the well with a low impedance through the interconnections and switch 50. Therefore, the potential of P well 28 can be fixed more strongly through dummy field 42.

Figure 7:
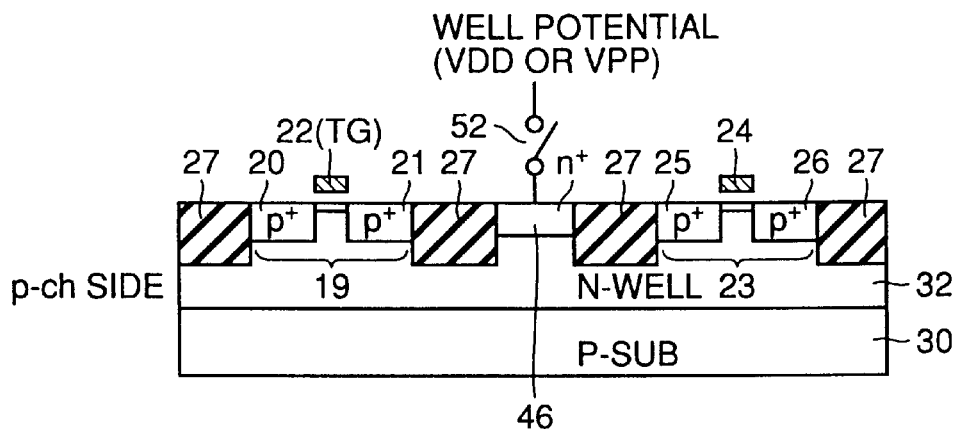
FIG. 7 is a cross sectional view showing the B1—B1 cross sectional structure in FIG. 5.

Referring to FIG. 7, in the B1—B1 cross section in FIG. 5, N well 32 is formed in P type substrate 30, and P type transistors 19, 23 are formed on N well 32.

Transistor 19 is formed of P type impurity-doped regions 20, 21 and gate electrode 22. Transistor 23 is formed of P type impurity-doped regions 25, 26 and gate electrode 24.

Dummy field 46 is provided between impurity-doped regions 21, 25. Transistors 19, 23 and dummy field 46 are electrically isolated by element isolating region 27.

Dummy field 46 is implanted with an impurity of the same conductivity type (that is, the N type) as N well 32.

Therefore, the potential of N well 32 can be fixed more strongly by supplying impurity-doped region 46 with power supply voltage VDD or boosted potential VPP, which is the potential of N well 32, through switch 52 from the interconnections.

Figure 8:
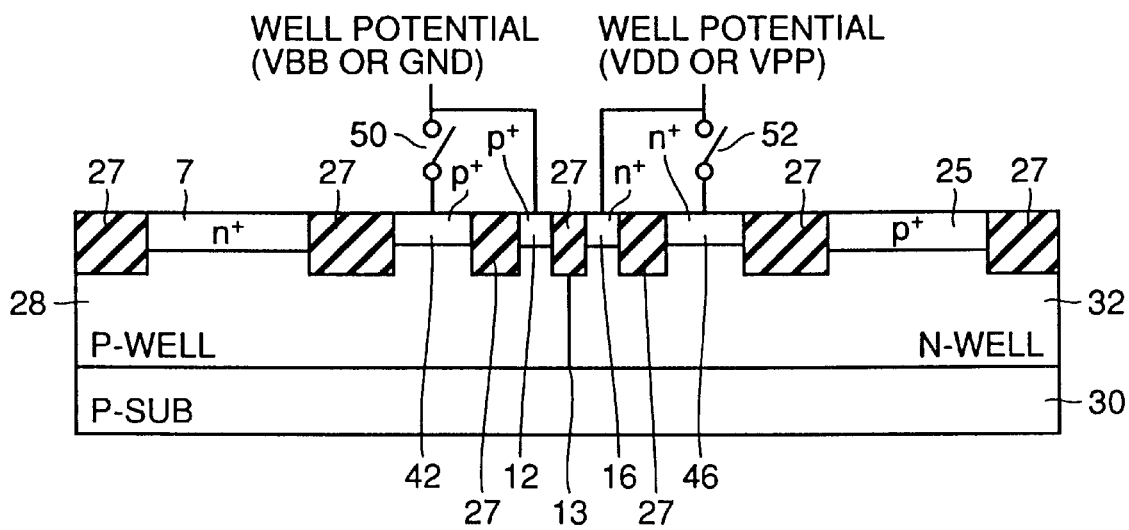
FIG. 8 is a cross sectional view showing the C1—C1 cross sectional structure in FIG. 5.

Referring to FIG. 8, in the C1—C1 cross section in FIG. 5, P well 28 and N well 32 are formed at the main surface of P type substrate 30 and their boundary is boundary 13. N type impurity-doped region 7, P type impurity-doped region 12 and dummy field 42 are formed in the P well. Impurity-doped regions 7,12 and dummy field 42 are electrically isolated by element isolating region 27.

Dummy field 42 is implanted with a P type impurity having the same conductivity type as the well. Dummy field 42 is supplied with substrate potential VBB or ground potential Vss, which is the potential of P well 28, through switch 50.

Therefore, P well 28 has its potential fixed not only by impurity-doped region 12 but by dummy field 42 and thus the potential is fixed more strongly.

In N well 32, P type impurity-doped region 25, N type impurity-doped region 16 and dummy field 46 are formed. Impurity-doped regions 25, 16 and dummy field 44 are electrically isolated by element isolating region 27. Dummy field 46 is implanted with an impurity of the same conductivity type as N well 32, that is, the N type and supplied with power supply potential VDD or boosted potential VPP, which is the potential of the N well, through switch 52.

Therefore, the potential of N well 32 is fixed not only by impurity-doped region 16 but by dummy field 46 and thus the potential is fixed more strongly by dummy field 46.

As described above, the well potential can be fixed more strongly by supplying a fixed potential through a low resistive interconnection and through a dummy field in which an impurity of the same conductivity type as the well is implanted. Thus, a latch up phenomenon due to noise or the like can be suppressed.

Referring to FIGS. 9 to 19, a method of forming the dummy field having the above described structure will be described in the following.

Figure 9:
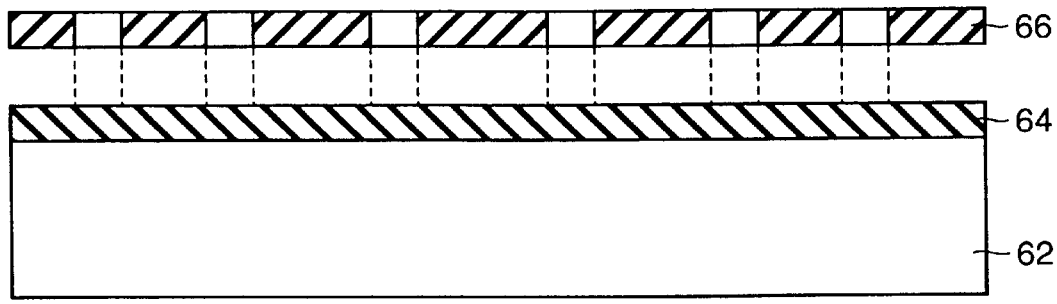
FIGS. 9 to 19 are cross sectional views showing first to eleventh steps of a process of forming the semiconductor device in the first embodiment of the present invention.

Referring to FIG. 9, a stopper layer 64 for preventing chemical mechanical polishing is formed on a main surface of a silicon substrate 62 and the lithography process using a photomask 66 is then performed.

Figure 10:
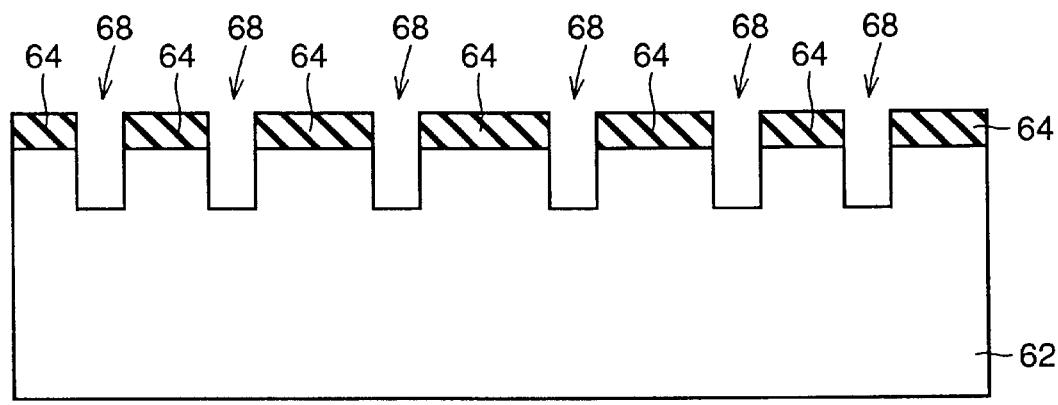

Referring to FIG. 10, an element isolating region is determined after the lithography process, and a portion serving as the element isolating region is selectively etched to form a trench 68.

Figure 11:
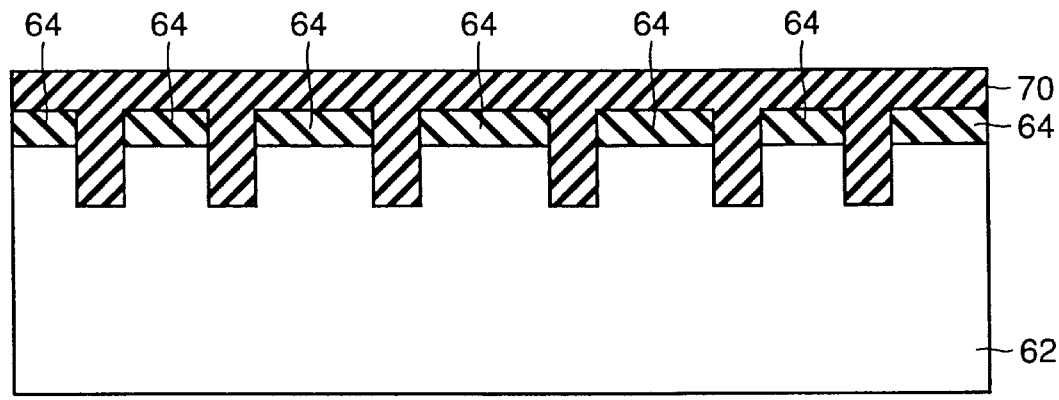

Referring to FIG. 11, an insulating material 70 is deposited on the main surface of semiconductor substrate 62.

Figure 12:
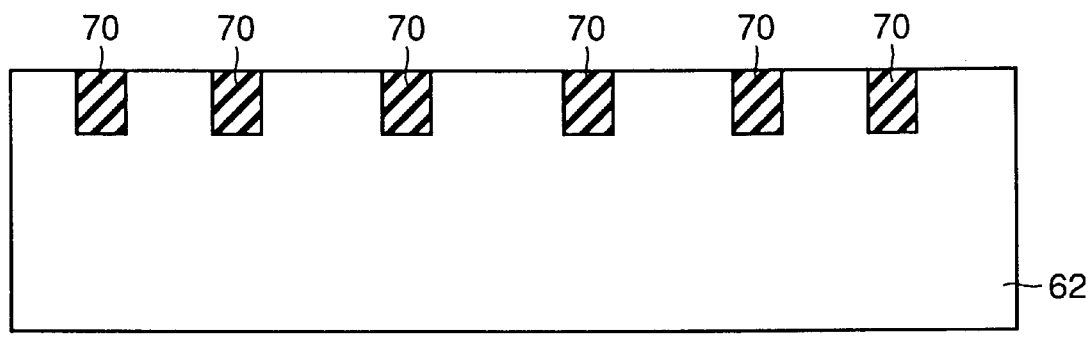

Referring to FIG. 12, the main surface of the semiconductor substrate is polished to be planarized by the CMP process and insulating material 70 in a portion other than the trench is removed.

Figure 13:
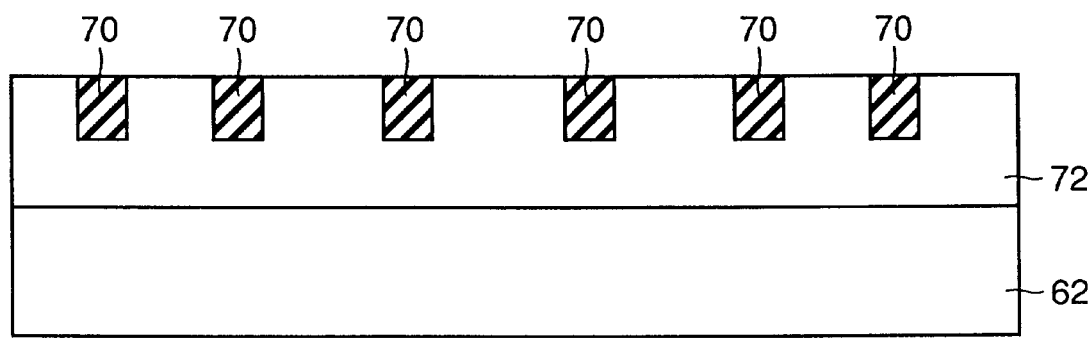

Referring to FIG. 13, the portion shown in the figure is a region for forming an N channel type transistor and therefore a P type impurity is implanted to form a P well 72.

A region, not shown, where a P channel type transistor is formed is not implanted with the P type impurity but it is selectively implanted with an N type impurity to form an N well before the P well is formed.

Figure 14:
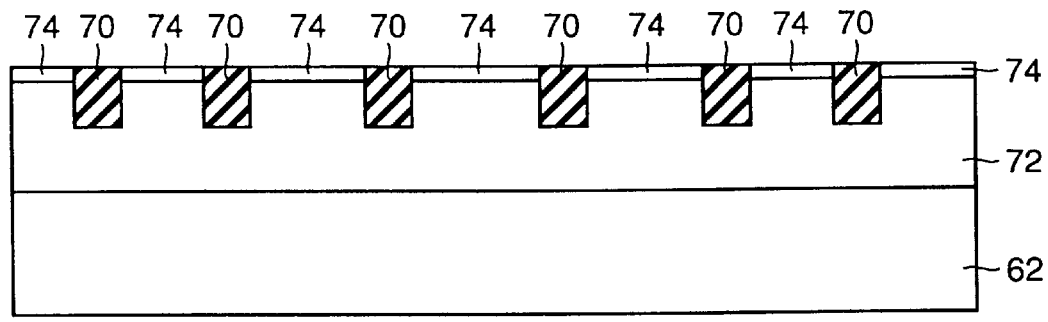

Referring to FIG. 14, an N type impurity-doped region 74 as a channel dope region for controlling a threshold voltage of an MOS transistor is formed in P well 72.

Figure 15:
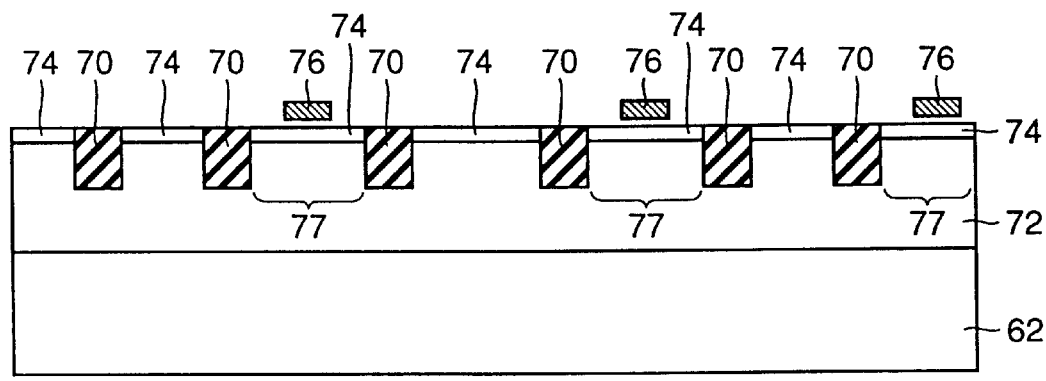

Referring to FIG. 15, a gate electrode 76 is formed on an active region 77 where a transistor is formed.

Figure 16:
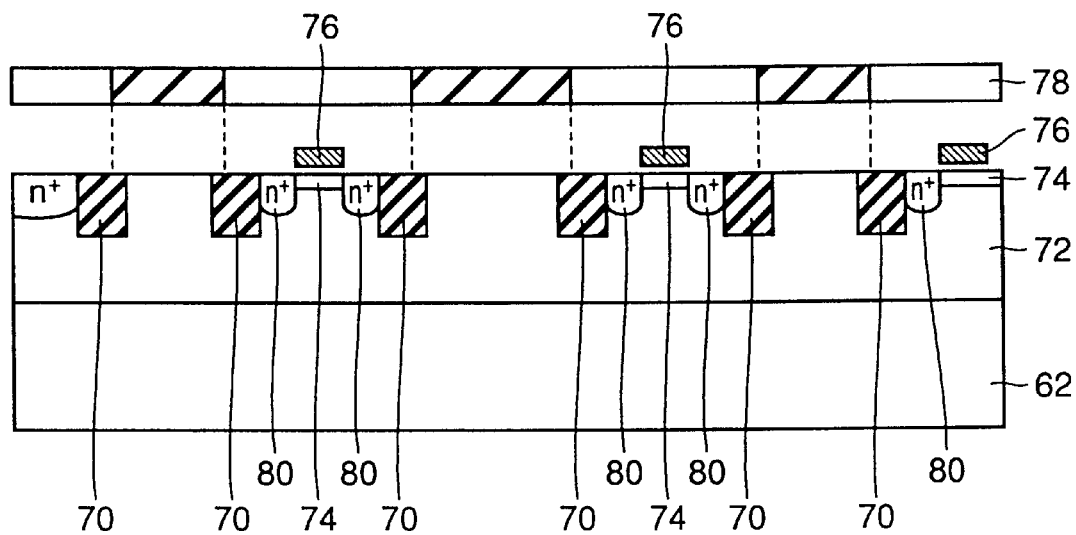

Referring to FIG. 16, the lithography process using a photomask 78 is performed and an N type impurity is implanted in the source/drain regions of a transistor to form impurity-doped regions 80.

Figure 17:
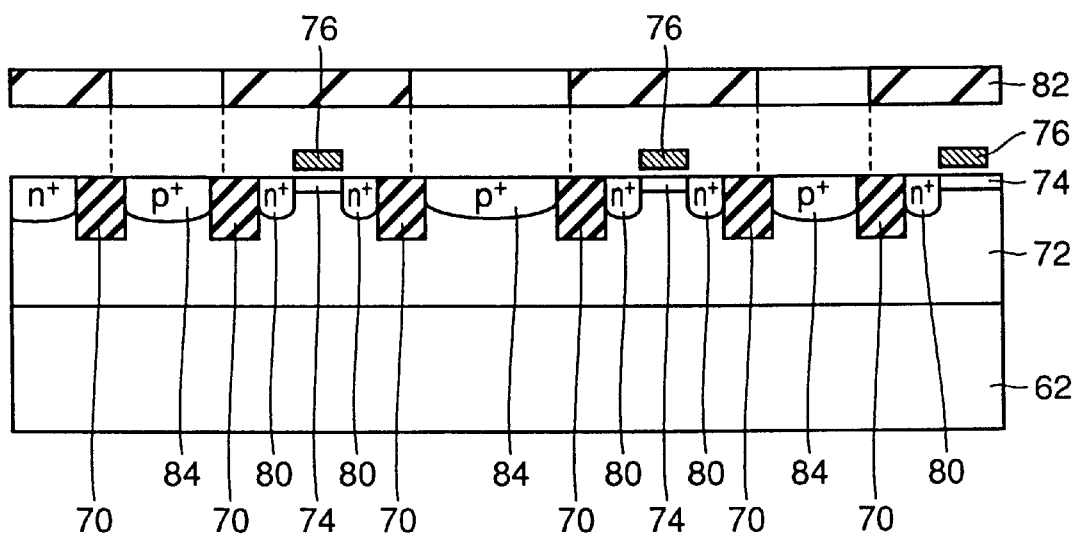

Referring to FIG. 17, the lithography process using a photomask 82 is performed to form a P type impurity-doped region 84 in a dummy field portion. At this time, the source/drain regions of a P channel transistor are simultaneously formed in a region, not shown, where a P channel transistor is formed.

The method is different from formation of a conventional dummy field in that the dummy field region can be utilized to fix the well potential by implanting an impurity of the same conductivity type as the well into the dummy field region.

Conventionally, the conductivity type of an impurity to be implanted into a dummy field was generally different from that of a well. In the conventional process, therefore, a dummy field adjacent to the transistor shown in FIG. 16 was generally implanted with the same impurity in forming the source/drain regions of the transistor, and a dummy field adjacent to the N channel transistor was not generally implanted with an impurity in the step shown in FIG. 17.

This is the first point of the semiconductor device in the first embodiment that is different from conventional devices.

If the semiconductor device is a semiconductor memory device including a memory cell, the method is followed by the step of forming a polysilicon interconnection serving as a cell plate or a bit line.

Figure 18:
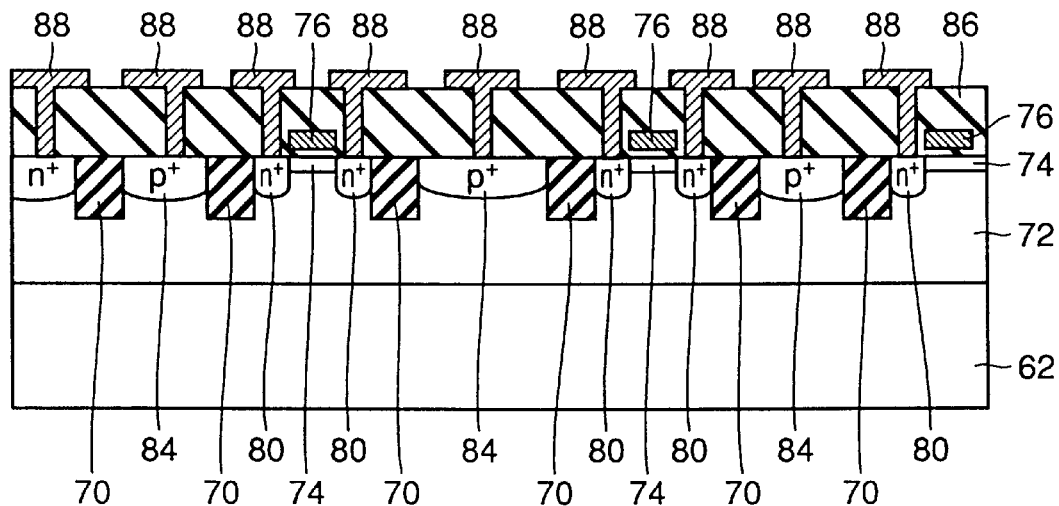

Referring to FIG. 18, an interlayer insulating film 86 is formed, a contact hole is provided in interlayer insulating film 86 on impurity-doped region 80 serving as the source/drain region of a transistor and on a dummy field 84, and a first metal interconnection 88 is also formed.

Figure 19:
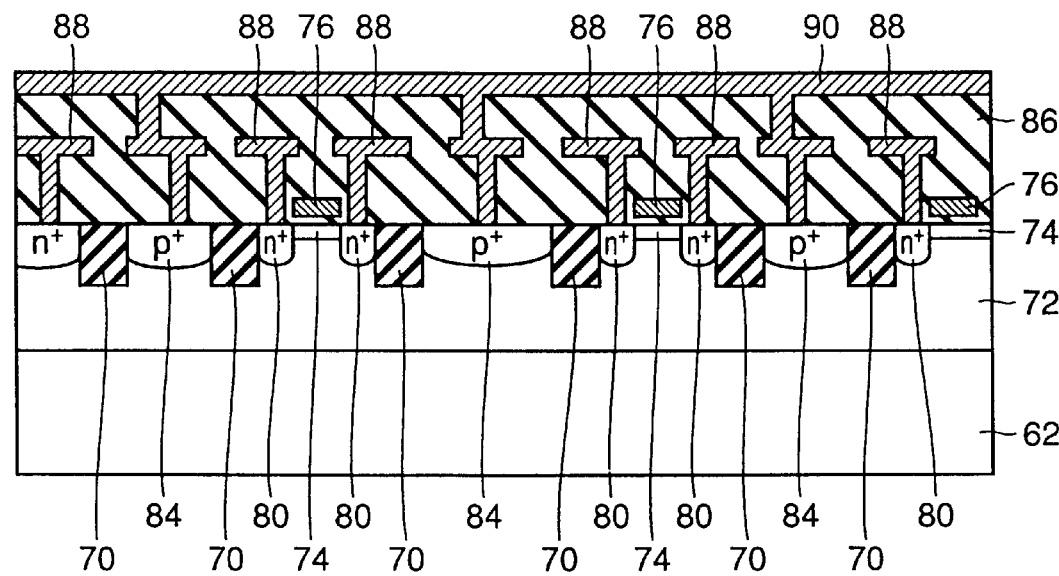

Referring to FIG. 19, a second metal interconnection 90 is formed that supplies a potential to a dummy field.

Thus, the dummy field portion is supplied with a potential by the interconnection and this is a second point in the first embodiment that is different from conventional devices.

Figure 20:
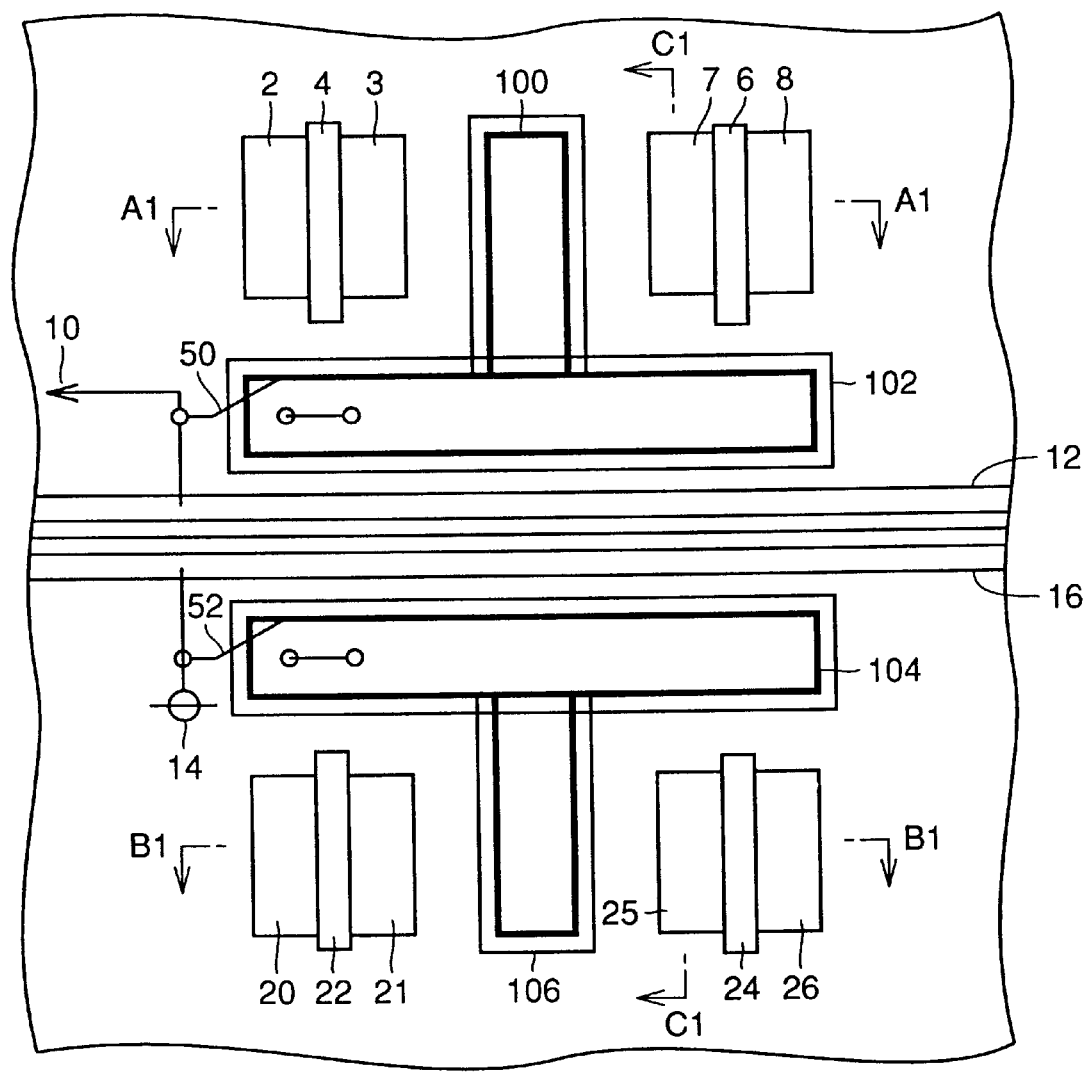
FIG. 20 is a plan view showing a variation of element arrangement of the semiconductor device in the first embodiment.

A different form of the dummy field will be described in the following. Referring to FIG. 20, a dummy field 100 in this case is different from dummy field 42 shown in FIG. 5 in that dummy field 100 has a form shaped by connecting dummy fields 42 shown in FIG. 5. Similarly, a dummy field 104 has a form shaped by connecting dummy fields 46 shown in FIG. 5.

A region 102 surrounding the outside of dummy field 100 is implanted with an impurity of the same conductivity type as a well region where dummy field 100 is provided. Similarly, a region 106 surrounding the outside of dummy field 104 is a region implanted with an impurity of the same conductivity type as a well where dummy field 104 is provided.

Since arrangement of other transistors, guard rings and the like is similar to the example shown in FIG. 5, their description will not be repeated. Since the A1—A1, B1—B1, C1—C1 cross sections in FIG. 20 have similar cross sectional structures to the A1—A1, B1—B1, C1—C1 cross sections in FIG. 5, their description will not be repeated.

As described above, in the semiconductor device of the first embodiment, the well potential can be fixed more strongly by implanting an impurity of the same conductivity type as the well into a dummy field which was conventionally implanted with an impurity of a different conductivity type from that of the well and was electrically in a floating state and by supplying the dummy field portion with a potential through a low resistive interconnection such as a metal interconnection. Therefore, occurrence of latch up due, for example, to noise can be suppressed.

[Second Embodiment]

The case where a dummy field is used as a decoupling capacitor connected between two power supply potentials will be described in the following.

Figure 21:
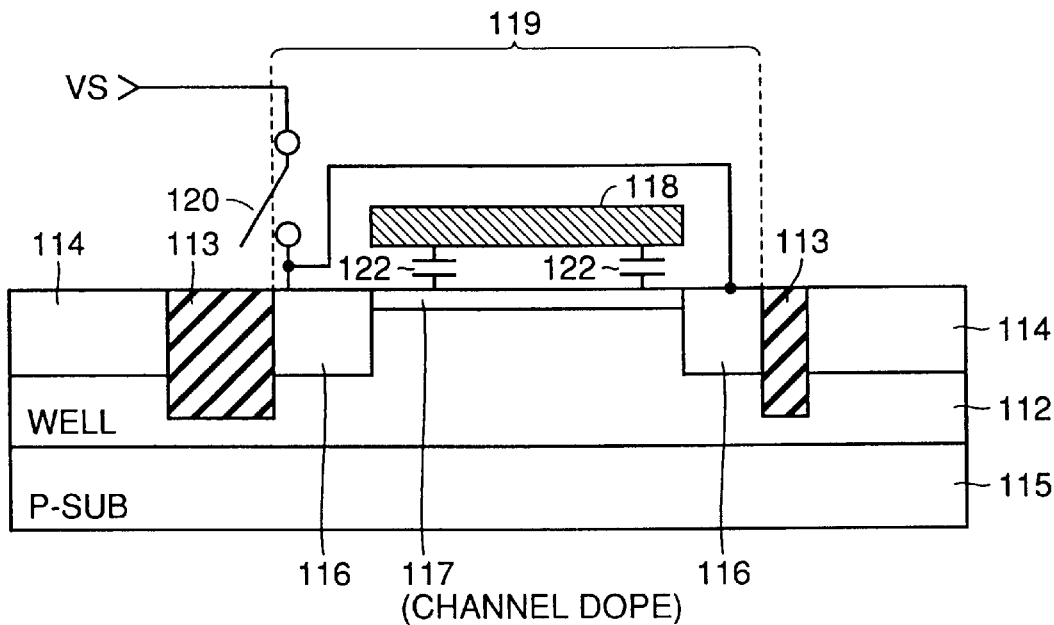
FIG. 21 is a cross sectional view showing the cross sectional structure of a dummy field portion in a second embodiment.

Referring to FIG. 21, a well 112 is formed on a main surface of a P type substrate, and a dummy field 119 is isolated from an active region 114, where a transistor is formed, by a trench portion 113 serving as an element isolating region. Since a gate electrode 118 is formed on dummy field 119, an MOS capacitor is formed in the dummy field. In FIG. 21, a capacitor 122 is the equivalent circuit of the capacitor.

In well 112, an impurity-doped region 116 is formed as a source in a portion on which gate electrode 118 is not formed, and an impurity-doped region 117 is formed by channel doping in a portion on which a gate electrode is formed.

Impurity-doped region 116 that is the source of an MOS capacitor is supplied with a fixed potential VS through a switch 120.

When a dummy field in the P well is used as a decoupling capacitor as one case, impurity-doped region 116 in the dummy field and fixed potential VS are made the N type and VSS, respectively. When the potential of gate electrode 118 is made power supply potential Vcc, a decoupling capacitor between power supply potential Vcc and ground potential Vss is formed.

When a dummy field in the N well is used as another case, impurity-doped region 116, fixed potential VS and the potential of gate electrode 118 are made the P type, power supply potential Vcc and ground potential Vss, respectively. Thus, a decoupling capacitor between ground potential Vss and power supply potential Vcc is formed.

When a dummy field in the P well is used as still another case, and impurity-doped region 116, fixed potential VS and the potential of the gate electrode are made the P type, ground potential Vss and substrate potential VBB, respectively, a decoupling capacitor between ground potential Vss and substrate potential VBB is formed. When a dummy field in the N well is used, and impurity-doped region 116, fixed potential VS and the potential of gate electrode 118 are made the N type, power supply potential Vcc and boosted potential Vpp, respectively, a decoupling capacitor between power supply potential Vcc and boosted potential Vpp is formed. As described above, a dummy field can be used as a decoupling capacitor between various power supplies by forming an MOS capacitor in the dummy field. Thus, the noise resistivity of a semiconductor device can be improved.

[Third Embodiment]

The second embodiment shows the example where an MOS capacitor is formed as a decoupling capacitor for power supplies in a dummy field. In the third embodiment, a capacitor is formed for canceling noise of a particular signal.

Figure 22:
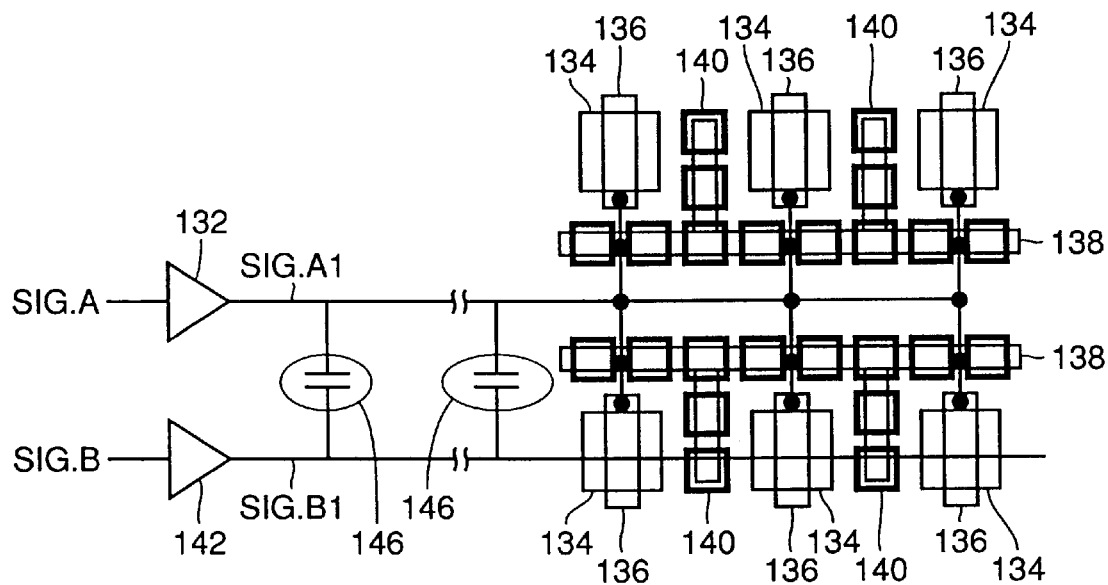
FIG. 22 is a schematic diagram for illustrating the arrangement of elements in a third embodiment.

Referring to FIG. 22, it is assumed here that a signal SIG.A is amplified by a buffer 132 and input as a signal SIG.A1 to the gate electrode 136 of a transistor at the next stage.

In this case, interconnection capacitance may be at least 1pF and interconnection resistance may be at least several Ω if the distance from the output portion of buffer 132 to gate electrode 136 of the transistor at the next stage is large.

When an interconnection connected to the output of a buffer 142 receiving a signal SIG.B and outputting a signal SIG.B1 is arranged close and parallel to an interconnection connected the output of buffer 132 in this situation, for example, signal SIG.B1 may influence signal SIG.A1. This is due to parasitic capacitance 146 formed between the interconnections.

Then, a gate electrode 138 is formed on a dummy field 140 near the interconnection transmitting signal SIG.A1 and gate electrode 138 is connected to the output of buffer 132. In this case, capacitance of at least capacitance 146 formed between the interconnections has to be added to the output of buffer 132 by utilizing the dummy field.

Figure 23:
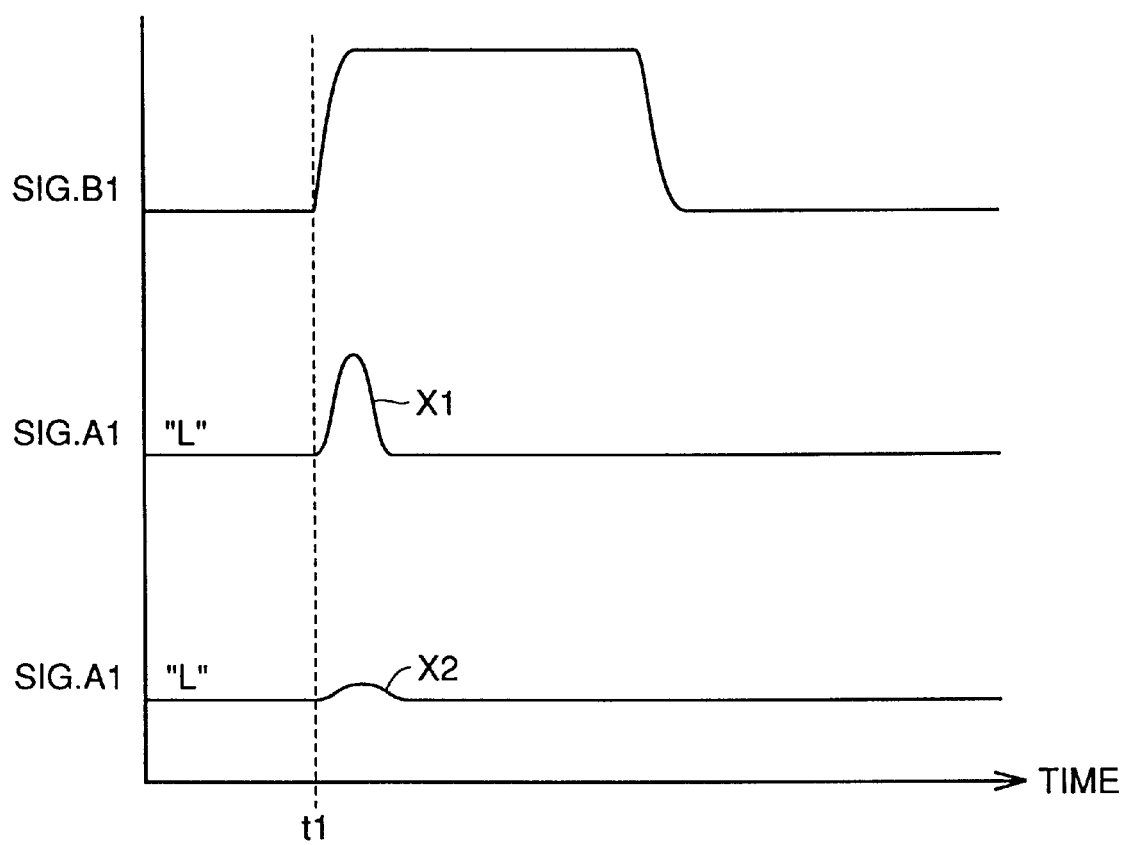
FIG. 23 is a waveform chart for illustrating propagation of signals in the third embodiment.

FIG. 23 is a chart for illustrating operation of the capacitor for noise cancellation shown in FIG. 22.

When signal SIG.B1 rises at time t1, noise as denoted by a waveform X1 is caused on signal SIG.A1 if the capacitor for noise cancellation utilizing the dummy field is not added. If the capacitor utilizing the dummy filed is added, the influence of signal SIG.B1 can be reduced as shown by a waveform X2.

As described above, a capacitor for canceling noise of a particular signal can be formed by utilizing a dummy field as in the third embodiment. Thus, the noise resistivity of a semiconductor device can be improved.

[Fourth Embodiment]

Figure 24:
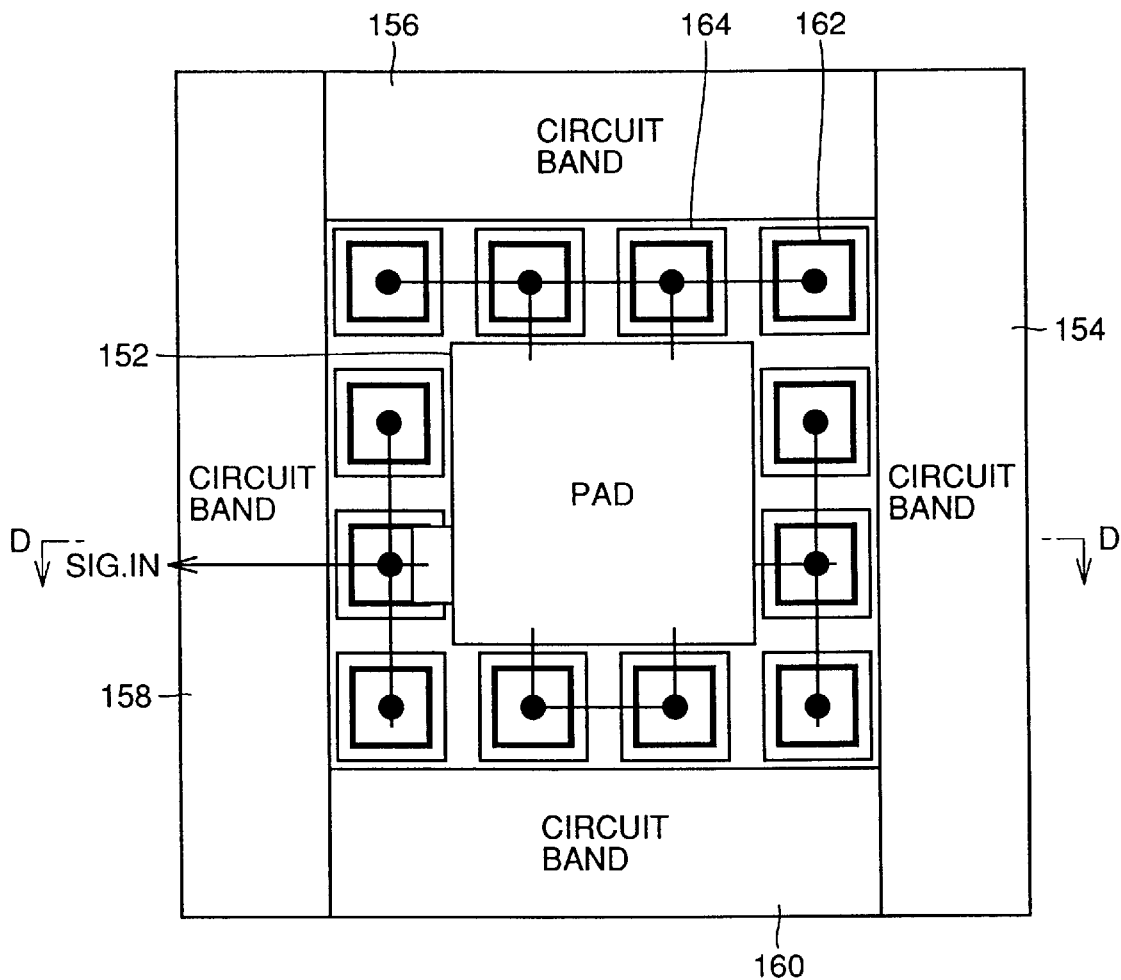
FIG. 24 is a plan view for illustrating the arrangement of elements in a fourth embodiment.

FIG. 24 is a plan view for illustrating an example of utilizing dummy fields that are provided near circuit bands that are arranged around a pad as a protection circuit against noise input from the pad.

Referring to FIG. 24, circuit bands 154, 156, 158 and 160 are arranged around a pad 152 and, between the pad and these circuit bands, a plurality of divided dummy fields 162 are formed. Here, a region 164 outside dummy field 162 is a region for implanting an impurity into the dummy field.

When the dummy field is electrically connected to the pad by a metal interconnection, the dummy field functions as an input protection circuit or a cramping circuit for protecting internal circuitry receiving an input signal from the pad.

Figure 25:
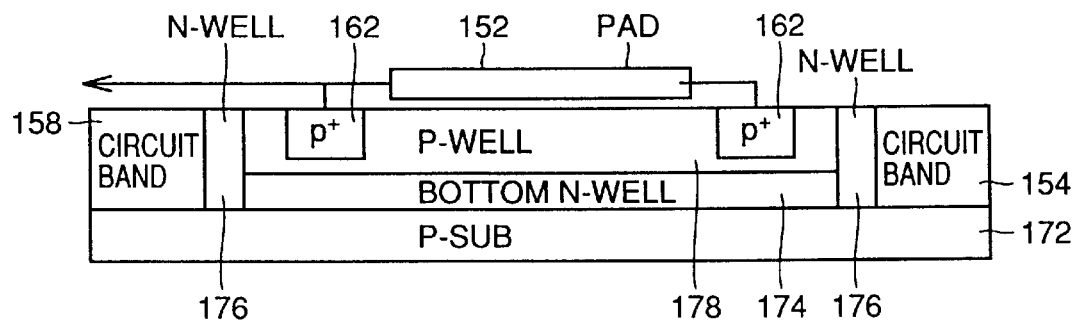
FIG. 25 is a cross sectional view of a first example showing the D—D cross sectional structure in FIG. 24.

FIG. 25 is a first example showing the D—D cross section in FIG. 24.

Referring to FIG. 25, a bottom N well 174 is formed in a P substrate 172, and an N well 176 is formed on both sides of the bottom N well. A P well 178 is formed on bottom N well 174 in P substrate 172, and P well 178 is surrounded by N well 176 and the bottom N well and normally electrically isolated from P substrate 172. In the P well, dummy fields 162 are formed in a region sandwiched by pad 152 and circuit bands 158, 154. These dummy fields are P type impurity-doped regions.

When a surge is externally applied to pad 152 in this case, the surge first passes from dummy field 162 to P well 178. The surge then passes from P well 178 to N well 176. The surge is absorbed by a power supply node if N well 176 has power supply potential Vcc. When the N well is in a floating state, P substrate 172 is normally connected to a ground node and has ground potential Vss, and therefore the surge applied to pad 152 passes through dummy field 162, P well 178, bottom N well 174, P substrate 172 in this order and the surge is absorbed by the ground node.

Figure 26:
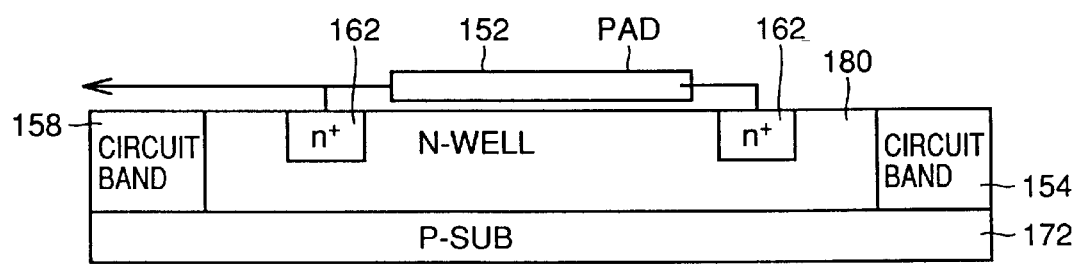
FIG. 26 is a cross sectional view of a second example showing the D—D cross sectional structure in FIG. 24.

FIG. 26 is a view showing a second example of the D—D cross section in FIG. 24.

Referring to FIG. 26, an N well 180 is formed on P substrate 172 and dummy fields 162 are formed in regions between pad 152 and circuit bands 158, 154 in the N well. In this example, dummy fields 162 are N type impurity-doped regions. In this case, a surge applied to pad 152 passes from dummy field 162 to N well 180 and further to P substrate 172. Since the P substrate is connected to a ground node and has ground potential Vss at this time, the surge is absorbed by the ground node or passed to a power supply node in circuit band 158 adjacent to N well 180.

It is assumed here that the dummy field functions as a clamping circuit.

If an overshoot is caused in the case of FIG. 25, a forward current flows from dummy field 162 to P well 178 further to the N well and the overshoot is absorbed.

If an undershoot is caused in the case of FIG. 26, a current flows from P substrate 172 to N well 180, so that the undershoot is absorbed by N well 180 and the dummy field functions as a clamping circuit.

As described above, the input protection circuit or the clamping circuit can be made by utilizing the dummy fields provided around the input pad. Thus, a more noise-resistant semiconductor device can be provided.

Figure 27:
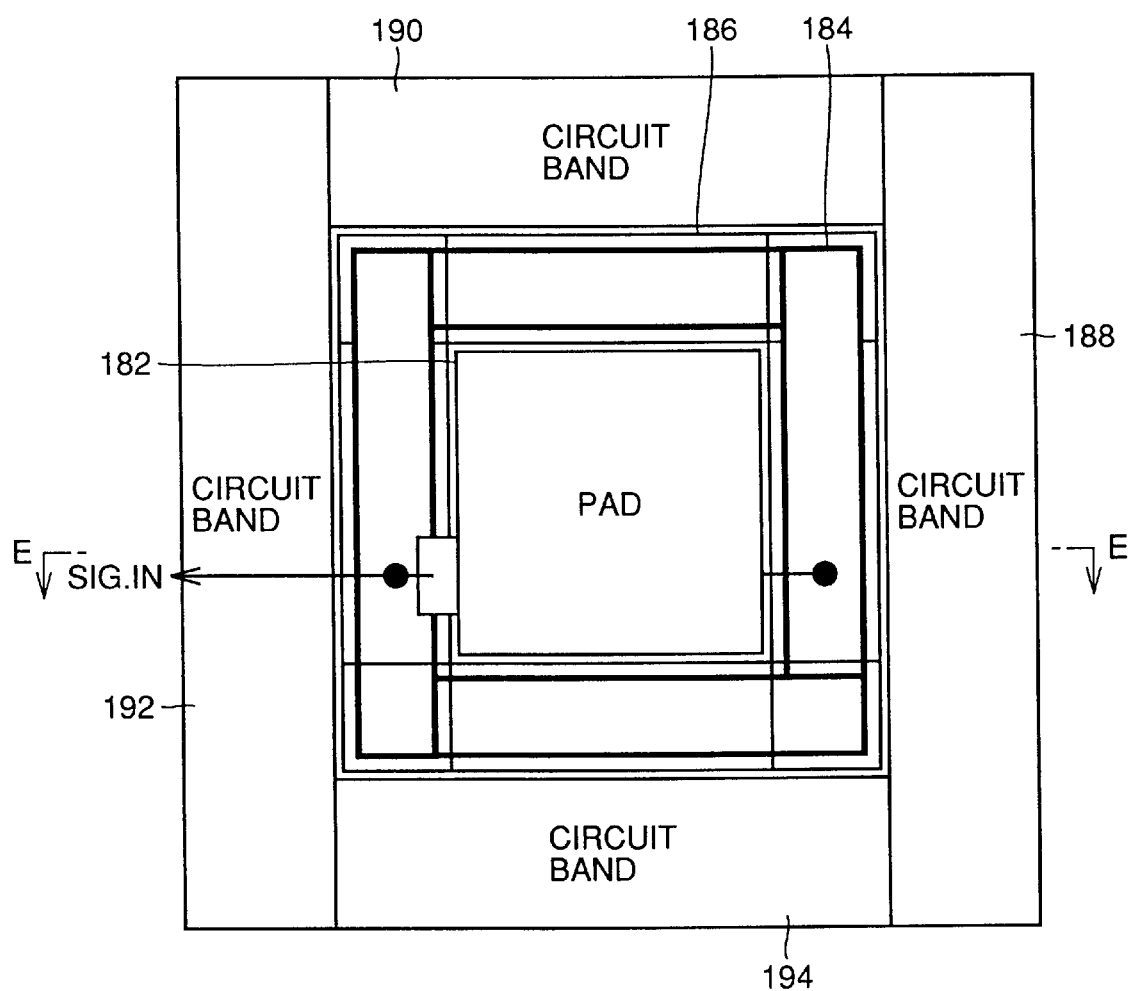
FIG. 27 is a plan view showing a first variation of the arrangement of elements in the fourth embodiment.

FIG. 27 is a plan view showing a variation of the dummy field arrangement shown in FIG. 24.

Referring to FIG. 27, dummy fields 184 are provided between a pad 182 and circuit bands 188 to 194. Here, a region denoted by 186 is a region for implanting an impurity into dummy fields 184. Since the E—E cross section shown in FIG. 27 has a similar structure to the D—D cross section shown in FIG. 24, the description will not be repeated.

The dummy field can also be used as a protection circuit or a clamping circuit in such a planar arrangement.

[Fifth Embodiment]

Figure 28:
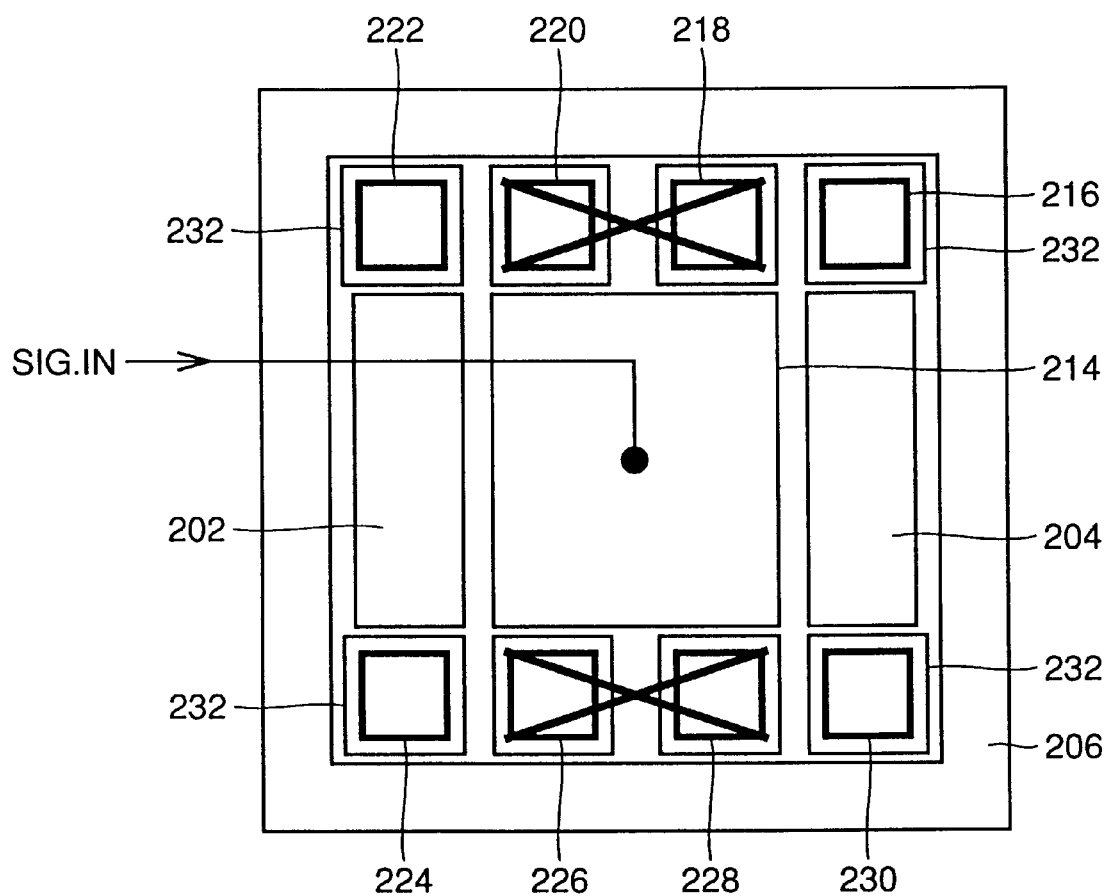
FIG. 28 is a plan view for illustrating the arrangement of elements in a fifth embodiment.
Figure 29:
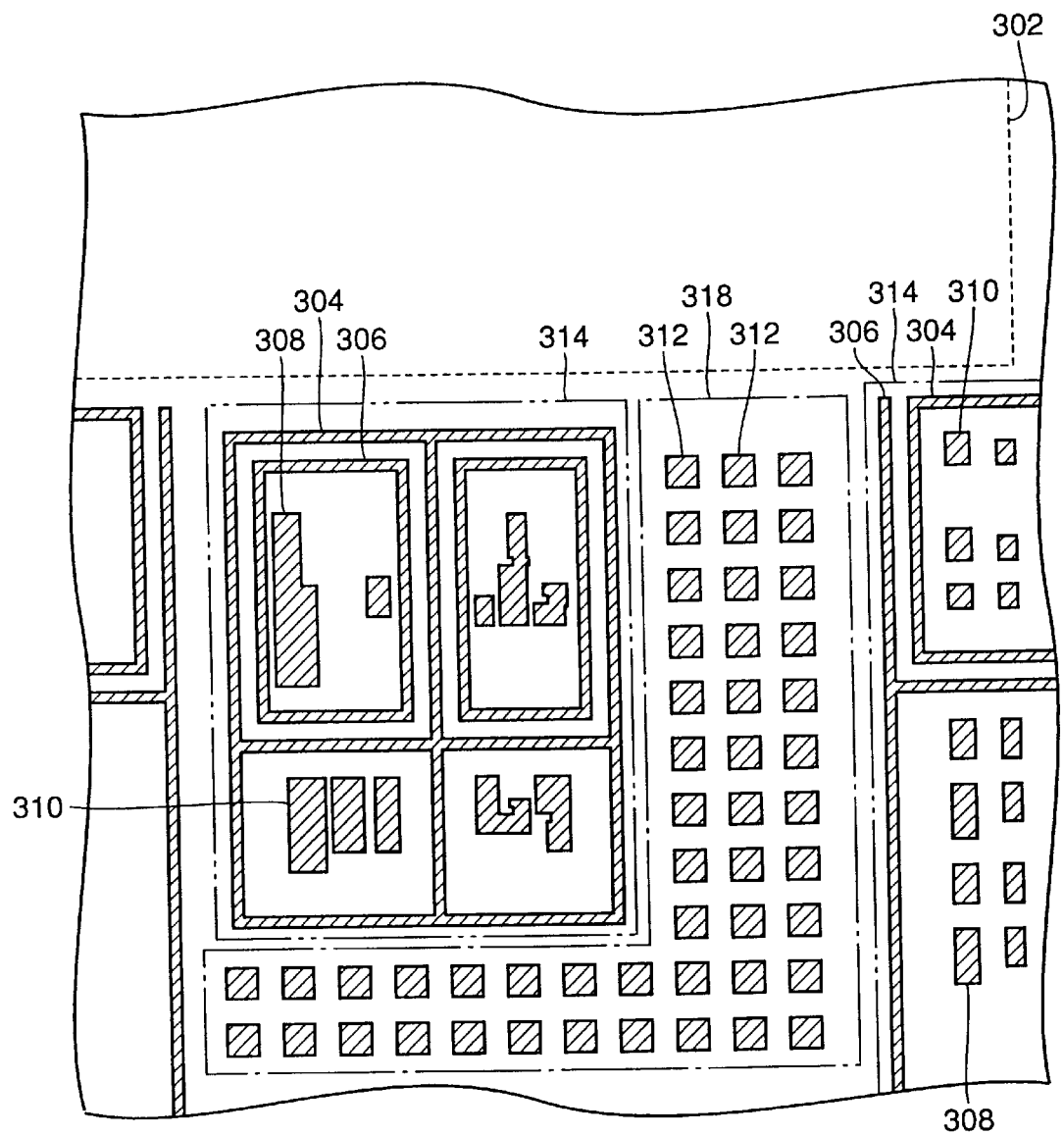
FIG. 29 is a plan view for illustrating a dummy field.
Figure 30:
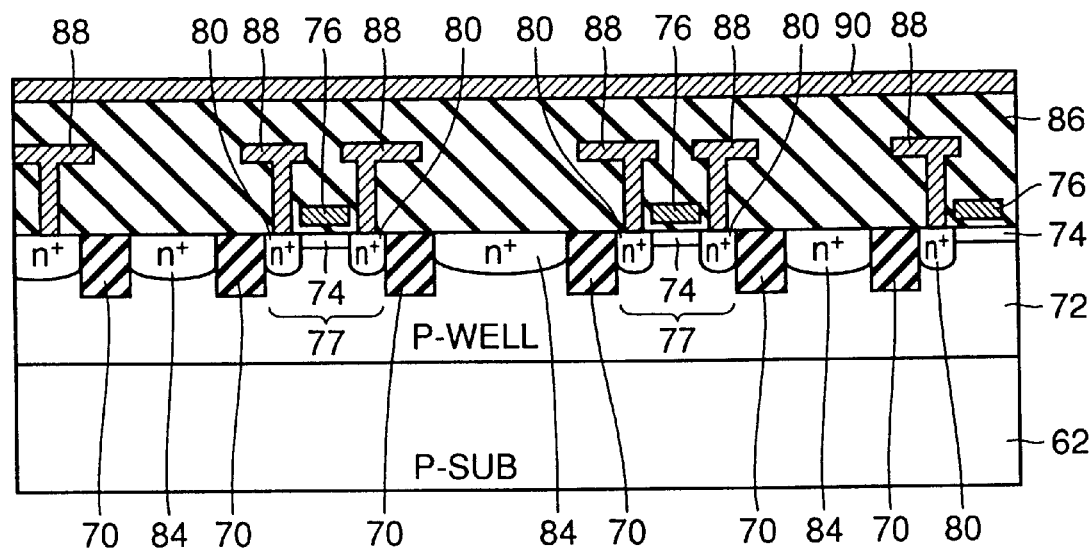
FIG. 30 is a cross sectional view showing the cross sectional structure of a dummy field in a conventional semiconductor device.
Figure 31:
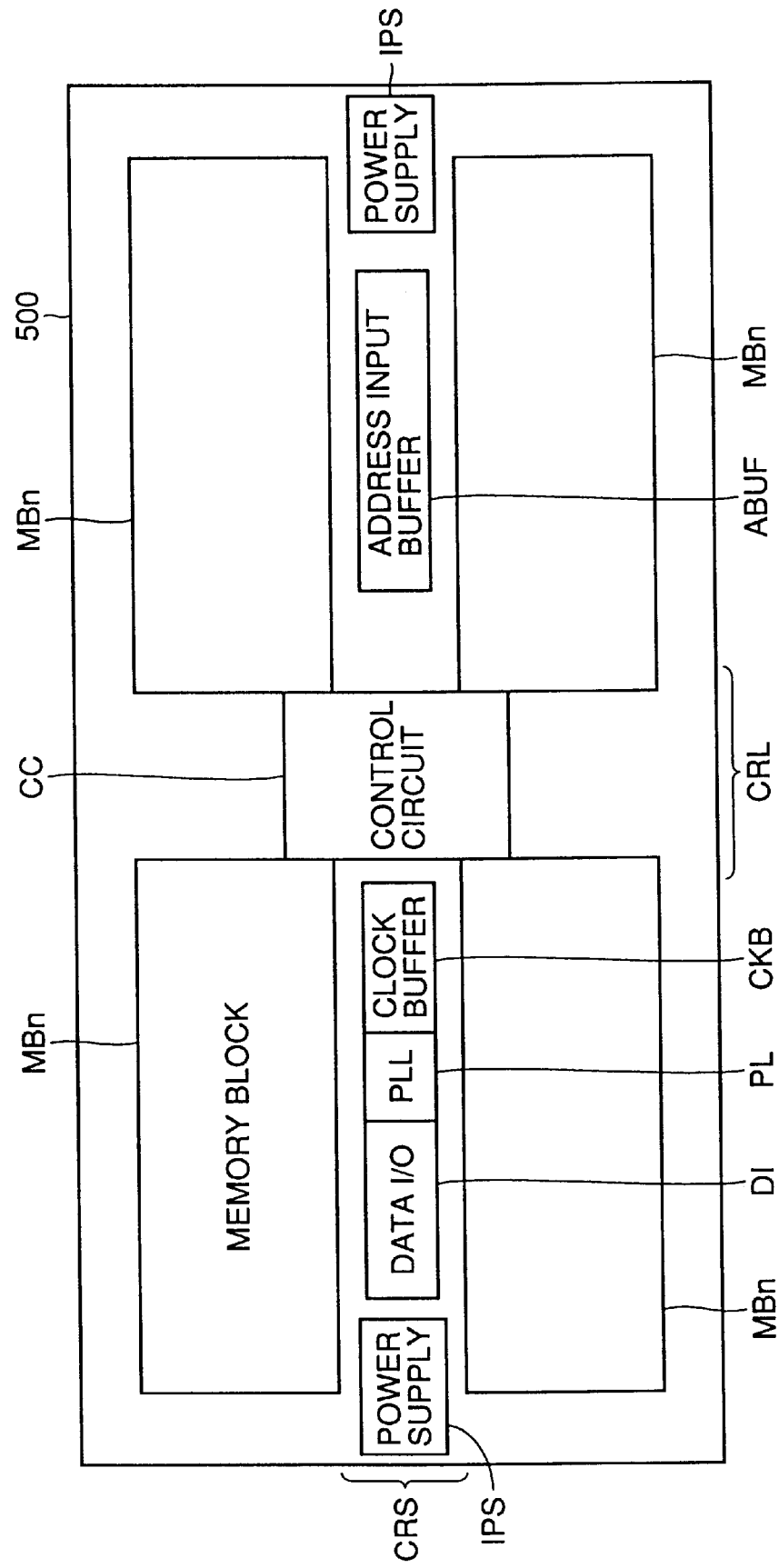
FIG. 31 is a plan view showing circuit arrangement of the conventional semiconductor device.

FIG. 28 is a plan view when a dummy field is provided in an input protection circuit connected to a pad.

Referring to FIG. 28, the input protection circuit is connected to a metal interconnection transmitting a signal from the pad to internal circuitry and the input protection circuit is used for protecting the internal circuitry against an externally applied surge and so on.

A region 214 is an impurity-doped region connected to the pad by a metal interconnection layer, and impurity-doped regions 202, 204 for surge absorption fixed to the ground potential are formed on both sides of region 214. An impurity-doped region 206 is provided to surround impurity-doped regions 202, 214, 204, and the potential of impurity-doped region 206 is fixed to the power supply potential (Vcc). An isolating region is formed between impurity-doped regions 214 and 204 and an isolating region also exists between impurity-doped regions 202 and 214.

A parasitic MOS transistor is formed between impurity-doped regions 202 and 214. Similarly, a parasitic MOS transistor is formed between impurity-doped regions 214 and 204. These parasitic MOS transistors are not rendered conductive when they are used in a normal manner. When noise such as a surge of at least a prescribed value is applied, however, the parasitic MOS transistors are rendered conductive and the surge, for example, is absorbed by a ground node.

Since the parasitic MOS transistor is similarly formed between impurity-doped regions 214 and 204, a surge, for example, can also be absorbed by a power supply node.

As described above, a dummy field has to be provided when the trench width exceeds a prescribed value. If a dummy field is inserted since the width of an isolating region in a protection circuit of such a structure exceeds a prescribed value, however, the channel length of a parasitic MOS transistor may be changed. For example, dummy fields 218, 220, 226, 228 shown in FIG. 28 may change the electrical characteristics of the input protection circuit.

When a dummy field is automatically generated in a trench portion having at least a prescribed width and data for a photomask is produced, the electrical characteristics can be stabilized by canceling data of the dummy field in such a portion.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device formed on a main surface of a semiconductor substrate, comprising:

a plurality of active regions where transistors are formed;

an isolating region for electrically isolating said plurality of active regions;

at least one dummy active region provided in a part of said isolating region having at least a prescribed width for keeping precision in forms of said plurality of active regions during a process of forming said isolating region;

said dummy active region being isolated from said active regions by an isolating material filled in a trench formed in said semiconductor substrate; and an interconnection for electrically connecting said dummy active region to a prescribed internal node.

2. The semiconductor device according to claim 1, further comprising a well region of a first conductivity type where said plurality of active regions, said isolating region and said dummy active region are provided, wherein said dummy active region includes an impurity-doped region of said first conductivity type for electrically connecting said dummy active region to said interconnection, and said internal node is a power supply node supplied with a prescribed fixed potential.

3. The semiconductor device according to claim 1, wherein said dummy active region includes a capacitor having a first electrode and a second electrode, said prescribed internal node is supplied with a first power supply voltage, said first electrode includes a conductor which is provided on said semiconductor substrate with an insulating film interposed therebetween and supplied with a second power supply voltage, and said second electrode includes a region of said main surface under said conductor, and an impurity-doped region which is provided adjacent to said region and connected to said prescribed internal node through said interconnection.

4. The semiconductor device according to claim 1, further comprising a first power supply node, and a first signal interconnection for transmitting an internal signal, wherein said dummy active region includes a capacitor having a first electrode and a second electrode, said prescribed internal node is supplied with a first power supply voltage, said first electrode includes a conductor which is provided on said semiconductor substrate with an insulating film interposed therebetween and electrically connected to said first signal interconnection, and said second electrode includes a region of said main surface under said conductor, and an impurity-doped region which is provided adjacent to said region and connected to said prescribed internal node through said interconnection.

5. The semiconductor device according to claim 1, further comprising a well region of a first conductivity type where said isolating region and said dummy active region are provided, a pad for transmitting and receiving a signal to and from the outside, and internal circuitry for transmitting and receiving said signal to and from said pad to perform a prescribed operation, wherein said dummy active region is arranged between said internal circuitry and said pad and includes an impurity-doped region of said first conductivity type connected to said interconnection, and said internal node is a node for connecting said pad and said internal circuitry.

6. The semiconductor device according to claim 1, wherein said semiconductor device comprises a plurality of said dummy active regions provided in a matrix in said isolating region.

7. The semiconductor device according to claim 1, further comprising a memory block having memory cells arranged in a matrix, wherein said dummy active region is provided in a matrix in said isolating region when a width of the isolating region exceeds a prescribed value in a periphery region that is a region other than said memory block.

8. A semiconductor device formed on a main surface of a semiconductor substrate, comprising:

a plurality of active regions where transistors are formed;

a first isolating region for electrically isolating said active regions;

at least one dummy active region, provided in a part of said first isolating region having at least a prescribed width, for keeping precision in forms of said active regions during a process of forming said isolating region;

a pad for receiving a signal from the outside;

internal circuitry for receiving said signal through said pad to perform a prescribed operation;

a protection element for protecting said internal circuitry from a surge externally applied to said pad, said protection element including a well potion of a first conductivity type provided at said main surface, a first impurity-doped region of a second conductivity type provided at the surface of said well potion and electrically connected to said pad, a second impurity-doped region of said second conductivity type provided at the surface of said well potion and connected to a power supply node, and a second isolating region for isolating said first impunity-doped region from said second impurity-doped region.

* * * * *